US012764927B2

(12) United States Patent
Guo

(10) Patent No.: US 12,764,927 B2
(45) Date of Patent: Oct. 13, 2026

(54) STORAGE DEVICE AND METHOD FOR FORMING STORAGE DEVICE

(71) Applicant: CHANGXIN MEMORY TECHNOLOGIES, INC., Hefei City (CN)

(72) Inventor: Shuai Guo, Hefei (CN)

(73) Assignee: CHANGXIN MEMORY TECHNOLOGIES, INC., Hefei City (CN)

( * ) Notice: Subject to any disclaimer, the term of this patent is extended or adjusted under 35 U.S.C. 154(b) by 1104 days.

(21) Appl. No.: 17/844,249

(22) Filed: Jun. 20, 2022

(65) Prior Publication Data

US 2023/0084851 A1 Mar. 16, 2023

Related U.S. Application Data

(63) Continuation of application No. PCT/CN2022/071629, filed on Jan. 12, 2022.

(30) Foreign Application Priority Data

Sep. 15, 2021 (CN) ......................... 202111079099.5

(51) Int. Cl.
*H10B 12/00* (2023.01)

(52) U.S. Cl.
CPC ....... *H10B 12/053* (2023.02); *H10B 12/0335* (2023.02); *H10B 12/315* (2023.02); *H10B 12/34* (2023.02); *H10B 12/482* (2023.02)

(58) Field of Classification Search
CPC ............... H01L 21/027; H01L 21/0332; H01L 21/0334; H01L 21/0337
See application file for complete search history.

(56) References Cited

U.S. PATENT DOCUMENTS 8,497,174 B2 7/2013 Cho
2007/0051994 A1* 3/2007 Song ...................... H10B 12/01
257/296

(Continued)

FOREIGN PATENT DOCUMENTS

CN 110880510 A 3/2020
CN 110993565 A 4/2020

OTHER PUBLICATIONS

Extended European Search Report in application No. 22868533, mailed on Aug. 20, 2024.

*Primary Examiner* — Ori Nadav
(74) *Attorney, Agent, or Firm* — Syncoda LLC; Feng Ma

(57) ABSTRACT

A storage device and a method for forming a storage device are provided. The storage device includes: a semiconductor substrate, active areas being formed in the semiconductor substrate, and spaced apart from each other by first trenches and second trenches extending along a first direction and third trenches extending along a second direction; a bit line doped area arranged at a bottom portion of each second trench and at a bottom portion of a communication region of each third trench with each second trench; a first isolation layer arranged in each first trench and each third trench; a gate dielectric layer arranged on surfaces of the active areas and surrounding the active areas; metal gates arranged on a surface of the gate dielectric layer on side walls of the active areas and surrounding the active areas; and a source area arranged on a top surface of each active area.

14 Claims, 13 Drawing Sheets

(56) References Cited

U.S. PATENT DOCUMENTS

| | | | | |
|---|---|---|---|---|
| 2012/0094454 | A1* | 4/2012 | Cho | H10D 30/63 438/270 |
| 2012/0153379 | A1* | 6/2012 | Kim | H10D 30/025 257/329 |
| 2012/0214297 | A1 | 8/2012 | Cho | |
| 2014/0175555 | A1 | 6/2014 | Lee et al. | |
| 2016/0293419 | A1* | 10/2016 | Nam | H01L 23/528 |

* cited by examiner

STORAGE DEVICE AND METHOD FOR FORMING STORAGE DEVICE

CROSS-REFERENCE TO RELATED APPLICATIONS

This is a continuation application of International Patent Application No. PCT/CN2022/071629, filed on Jan. 12, 2022, which claims priority to Chinese Patent Application No. 202111079099.5, filed on Sep. 15, 2021 and entitled "STORAGE DEVICE AND METHOD FOR FORMING STORAGE DEVICE". The disclosures of International Patent Application No. PCT/CN2022/071629 and Chinese Patent Application No. 202111079099.5 are incorporated by reference herein in their entireties.

BACKGROUND

A Dynamic Random Access Memory (DRAM) is a semiconductor storage device commonly used in a computer and is composed of many repeated storage cells. Each storage cell generally includes a capacitor and a transistor. A gate of the transistor is connected to a word line, a drain area of the transistor is connected to a bit line, and a source of the transistor is connected to the capacitor. A voltage signal on the word line can control turning on or turning off of the transistor, and then the data information stored in the capacitor is read through the bit line, or the data information is written into the capacitor through the bit line for storage.

In order to improve the integration of the storage structure, the transistors in the existing Dynamic Random Access Memory (DRAM) generally adopt a trench-type transistor structure. However, the line width of the existing trench-type transistor structure has been reduced to the limit, so that the storage capacity of the DRAM cannot be further improved. Therefore, an urgent problem to be solved by those skilled in the art is how to further improve the storage capacity and the storage density of the DRAM.

SUMMARY

The disclosure relates to the field of memories, and in particular to a storage device and a method for forming a storage device.

In view of this, some embodiments of the disclosure provide a method for forming a storage device, which includes the following operations.

A semiconductor substrate is provided, and a plurality of active areas are formed in the semiconductor substrate, in which the plurality of active areas are spaced apart from each other by a plurality of first trenches and a plurality of second trenches extending along a first direction and a plurality of third trenches extending along a second direction, the plurality of first trenches and the plurality of second trenches communicate with the plurality of third trenches, the plurality of first trenches and the plurality of second trenches are spaced apart from each other in the first direction, a depth of each of the plurality of second trenches is less than a depth of each of the plurality of first trenches, and a depth of a region of each of the plurality of third trenches other than a communication region of each of the plurality of third trenches with each of the plurality of second trenches is greater than the depth of each of the plurality of second trenches.

A bit line doped areas is formed in the semiconductor substrate at a bottom portion of each of the plurality of second trenches and at a bottom portion of the communication region of each of the plurality of third trenches with each of the plurality of second trenches.

A first isolation layer is formed in each of plurality of the first trenches and each of the plurality of third trenches, in which a surface of the first isolation layer is lower than a surface of each of the plurality of active areas.

A gate dielectric layer surrounding the plurality of active areas is formed on the surfaces of the plurality of active areas.

A plurality of metal gates surrounding the plurality of active areas are formed on a surface of the gate dielectric layer arranged on side walls of the plurality of active areas, in which a top surface of each of the plurality of metal gates is lower than a top surface of each of the plurality of active areas.

A source area is formed on the top surface of each of the plurality of active areas.

Some other embodiments of the disclosure further provide a storage device, which includes:

- a semiconductor substrate, in which a plurality of active areas are formed in the semiconductor substrate, the plurality of active areas are spaced apart from each other by a plurality of first trenches and a plurality of second trenches extending along a first direction and a plurality of third trenches extending along a second direction, the plurality of first trenches and the plurality of second trenches communicate with the plurality of third trenches, the plurality of first trenches and the plurality of second trenches are spaced apart from each other in the first direction, a depth of each of the plurality of second trenches is less than a depth of each of the plurality of first trenches, and a depth of a region of each of the plurality of third trenches other than a communication region of each of the plurality of third trenches with each of the plurality of second trenches is greater than the depth of each of the plurality of second trenches;
- a bit line doped area arranged in the semiconductor substrate at a bottom portion of each of the plurality of second trenches and at a bottom portion of the communication region of each of the plurality of third trenches with each of the plurality of second trenches;
- a first isolation layer arranged in each of the plurality of first trenches and each of the plurality of third trenches, in which a surface of the first isolation layer is lower than a surface of each of the plurality of active areas;
- a gate dielectric layer arranged on the surfaces of the plurality of active areas and surrounding the plurality of active areas;
- a plurality of metal gates arranged on a surface of the gate dielectric layer on side walls of the plurality of active areas and surrounding the plurality of active areas, in which a top surface of each of the plurality of metal gates is lower than a top surface of each of the plurality of active areas; and
- a source area arranged on the top surface of each of the plurality of active areas.

DETAILED DESCRIPTION

As mentioned in the background, it is an urgent problem to be solved by those skilled in the art how to further improve the storage capacity and the storage density of the DRAM.

It has been found through researches that a trench-type transistor generally includes at least one buried word line in a semiconductor substrate and a drain area and at least one source area in the semiconductor substrate on both sides of the buried word line. Such a trench-type transistor occupies a relatively large area of the semiconductor substrate, which is not conducive to the improvement of the integration of the DRAM, so that the storage capacity and the storage density of the DRAM are limited.

For this purpose, the disclosure provides a new storage device and a method for forming a storage device, so that the storage capacity and the storage density of the storage device can be further improved.

In order to make the foregoing objectives, features, and advantages of the disclosure more apparent and lucid, various embodiments of the disclosure are described in detail below with reference to the accompanying drawings. When the embodiments of the disclosure are described in detail, for the convenience of description, a schematic diagram may be partially enlarged not according to a general scale, and the schematic diagram is only an example, and should not limit the protection scope of the disclosure herein. In addition, three-dimensional dimensions (length, width and depth) should be included in actual production.

Figure 19:
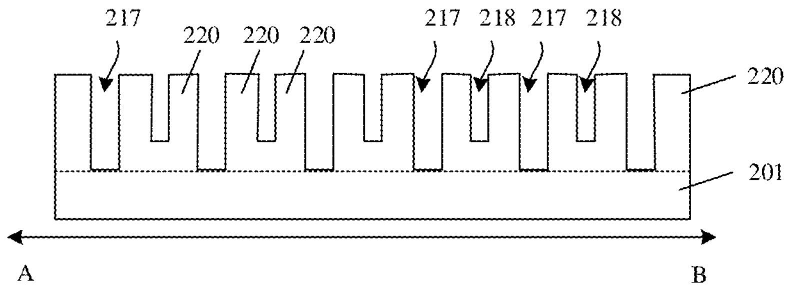
Figure 20:
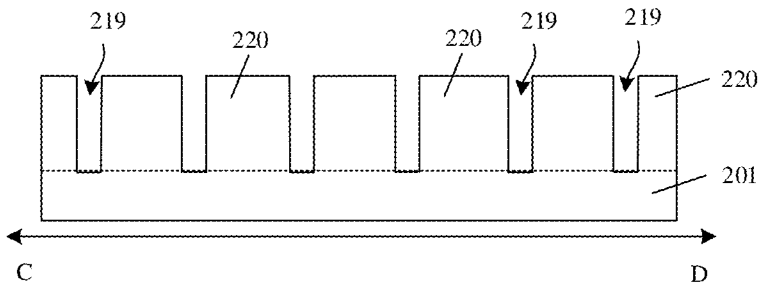
Figure 21:
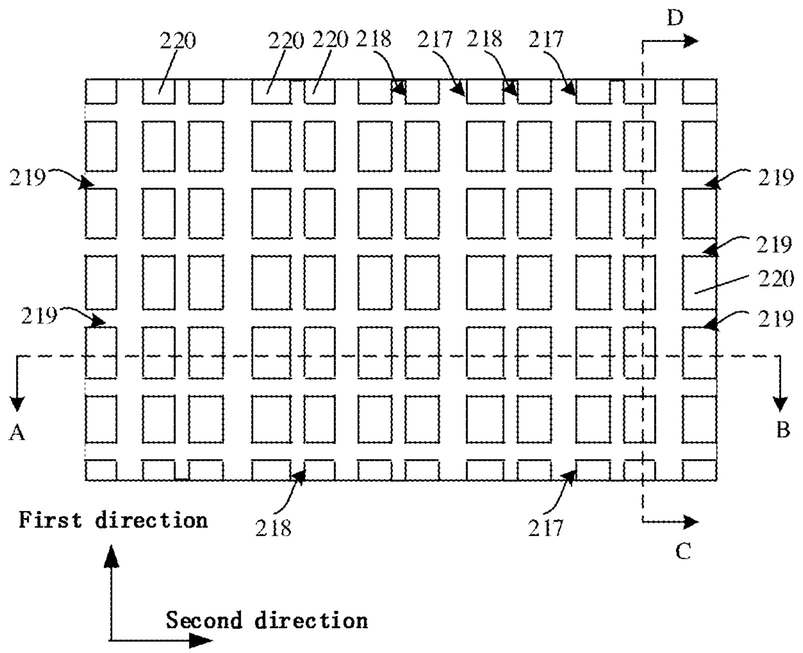

With reference to FIG. 19 to FIG. 21, FIG. 19 is a schematic cross-sectional view taken along a cutting line AB shown in FIG. 21, and FIG. 20 is a schematic cross-sectional view taken along a cutting line CD shown in FIG. 21. A semiconductor substrate 201 is provided, and a plurality of active areas 220 are formed in the semiconductor substrate 201. The plurality of active areas 220 are spaced apart from each other by a plurality of first trenches 217 and a plurality of second trenches 218 extending along a first direction and a plurality of third trenches 219 extending along a second direction. The plurality of first trenches 217 and the plurality of second trenches 218 communicate with the plurality of third trenches 219, and the plurality of first trenches 217 and the plurality of second trenches 218 are spaced apart from each other in the first direction. A depth of each of the plurality of second trenches 218 is less than a depth of each of the plurality of first trenches 217, and a depth of a region of each of the plurality of third trenches 219 other than a communication region of each of the plurality of third trenches with each of the plurality of second trenches 218 is greater than the depth of each of the plurality of second trenches 218.

The material of the semiconductor substrate 201 may be silicon (Si), germanium (Ge), silicon germanium (GeSi), or silicon carbide (SiC); may also be silicon-on-insulator (SOI) or germanium-on-insulator (GOI); or may also be other materials, for example, III-V group compounds such as gallium arsenide. In this embodiment, the material of the semiconductor substrate 201 is silicon. The semiconductor substrate 201 needs to be doped with certain impurity ions according to the type of the vertical transistor to be formed subsequently. For example, well area doping may be performed on the semiconductor substrate. The impurity ions may be N-type impurity ions or P-type impurity ions. The P-type impurity ions are one or more of boron ions, gallium ions or indium ions, and the N-type impurity ions are one or more of phosphorus ions, arsenic ions or antimony ions.

The active area 220 is configured to subsequently form a channel area, a source area, and a drain area of the vertical transistor, and the plurality of active areas 220 are discrete.

In some embodiments, the formed active areas 220 are arranged in rows and columns (with reference to FIG. 21). In other embodiments, the active areas may also be arranged in other manners.

In some embodiments, the first direction and the second direction are perpendicular to each other, and an angle between the first direction and the second direction is 90 degrees. In other embodiments, the first direction may not be perpendicular to the second direction. For example, the angle between the first direction and the second direction may be an acute angle.

In some embodiments, the plurality of second trenches 218 and the plurality of first trenches 217 extend along the first direction and are alternately distributed in the semiconductor substrate 201. The plurality of third trenches 219 extend along the second direction. The plurality of third trenches 219 communicate with the plurality of first trenches 217 and the plurality of second trenches 218 at intersections. The depth of each second trench 218 is less than the depth of each first trench 217. The depths of the communication regions of the third trenches 219 with the second trenches 218 are the same or have a small difference therebetween, and the depth of the region of each third trench 219 other than the communication region of each third trench 219 with each second trench 218 is greater than the depth of each second trench 218.

In some embodiments, a width of each first trench 217 may be greater than a width of each second trench 218.

In some embodiments, the semiconductor substrate 201 may be etched firstly, so as to form the plurality of first trenches 217 and the plurality of second trenches 218 extending along the first direction and spaced apart from each other. The depth of each formed first trench 217 is greater than the depth of each formed second trench. Then, the semiconductor substrate 201 is etched to form a plurality of third trenches 219 extending along the second direction, so as to form a plurality of discrete active areas 220. The depths of the communication regions of the third trenches 219 with the second trenches 218 are the same or have a small difference therebetween, and the depth of the region of each third trench 219 other than the communication region of each third trench 219 with each second trench 218 is greater than the depth of each second trench 218 (when the third trenches 219 are formed, a mask layer is firstly formed on the semiconductor substrate 201, and the positions at which the second trenches 218 and the first trenches 217 have been formed may be covered by the mask layer and may not be etched, the mask layer may only expose a surface of the semiconductor substrate between the first trenches and the second trenches that needs to be etched). In some embodiments, the semiconductor substrate 201 may be etched firstly to form a plurality of first trenches 217, and then the semiconductor substrate is etched to form a plurality of second trenches 218. The depth of each second trench 218 is less than the depth of each first trench 217. Finally the semiconductor substrate 201 is etched to form a plurality of third trenches 219, so as to form a plurality of discrete active areas 220. The depths of the communication regions of the third trenches 219 with the second trenches 218 are the same or have a small difference therebetween, and the depth of the region of each third trench 219 other than the communication region of each third trench 219 with each second trench 218 is greater than the depth of each second trench 218. In other embodiments, the first trenches 217, the second trenches 218, and the third trenches 219 may also be simultaneously formed by etching the semiconductor substrate 201.

In this embodiment, the plurality of active areas 220 are formed through a self-aligned double patterning mask process. The formation process of the active areas 220 is described in detail with reference to FIG. 1 to FIG. 21.

Figure 1:
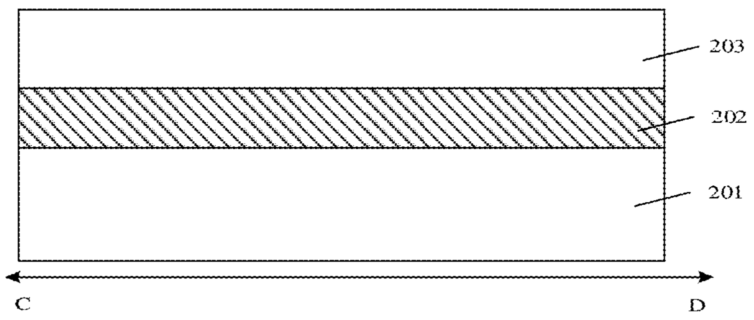
FIG. 1 to FIG. 43 are schematic diagrams of a formation process of a storage device according to some embodiments of the disclosure.

With reference to FIG. 1, a first hard mask layer 202 is formed on the semiconductor substrate 201; and a first material layer 203 is formed on the first hard mask layer 202.

The first hard mask layer 202 is configured to subsequently form a plurality of first mask patterns. In some embodiments, the first hard mask layer 202 may have a single-layer structure or a multi-layer stack structure, and the material of the first hard mask layer 202 may be one or more of polysilicon, amorphous silicon, amorphous carbon, silicon nitride, silicon oxynitride, silicon oxide, silicon nitride carbide, silicon oxycarbide, silicon carbide, and silicon germanium. The formation process of the first hard mask layer 202 may be an atmospheric or low pressure chemical vapor deposition (CVD) process, a plasma enhanced chemical vapor deposition (PECVD) process, a thermal chemical vapor deposition (Thermal CVD) process, a physical vapor deposition (PVD) process, an atomic layer deposition (ALD) process, a sputtering process, a plating process, an electroplating process, a spin coating process or other suitable processes, and/or a combination thereof. In this embodiment, the material of the first hard mask layer 202 is polysilicon.

In some embodiments, a first etch stop layer (not shown in the figure) may also be formed between the first hard mask layer 202 and the semiconductor substrate 201. The first etch stop layer is configured to protect the material layer below the first etch stop layer from being over-etched when the first hard mask layer is patterned. The material of the first etch stop layer is different from the material of the first hard mask layer, and the material of the first etch stop layer is one or more of silicon nitride, silicon oxynitride, silicon oxide, silicon nitride carbide, and silicon oxycarbide. In this embodiment, the material of the first etch stop layer is silicon oxide.

The first material layer 203 is configured to subsequently form a plurality of first strip structures. In some embodiments, the first material layer 203 may have a single-layer structure or a multi-layer stack structure, and the material of the first material layer 203 may be one or more of polysilicon, amorphous silicon, amorphous carbon, silicon nitride, silicon oxynitride, silicon oxide, silicon nitride carbide, silicon oxycarbide, silicon carbide, and silicon germanium. In this embodiment, the material of the first material layer 203 is amorphous carbon.

In some embodiments, a second etch stop layer (not shown in the figure) may also be formed between the first material layer 203 and the first hard mask layer 202. The second etch stop layer is configured to protect the material layer below the second etch stop layer from being over-etched when the first material layer 203 is patterned. The material of the second etch stop layer is different from the material of the first material layer 203. The material of the second etch stop layer is one or more of silicon nitride, silicon oxynitride, silicon oxide, silicon nitride carbide, and silicon oxycarbide. In this embodiment, the material of the second etch stop layer is silicon oxynitride.

Figure 2:
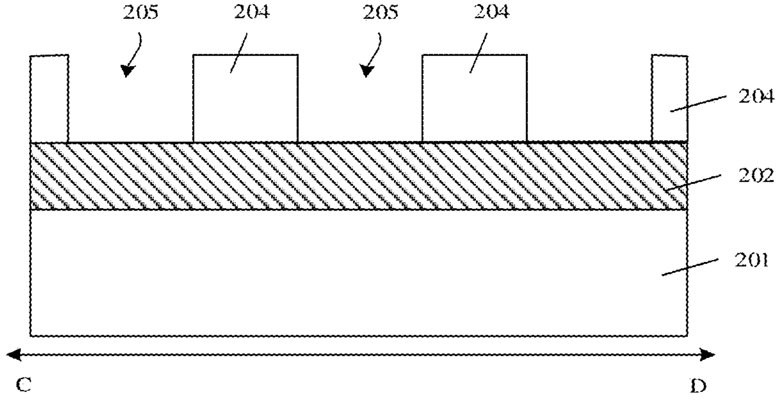
Figure 3:
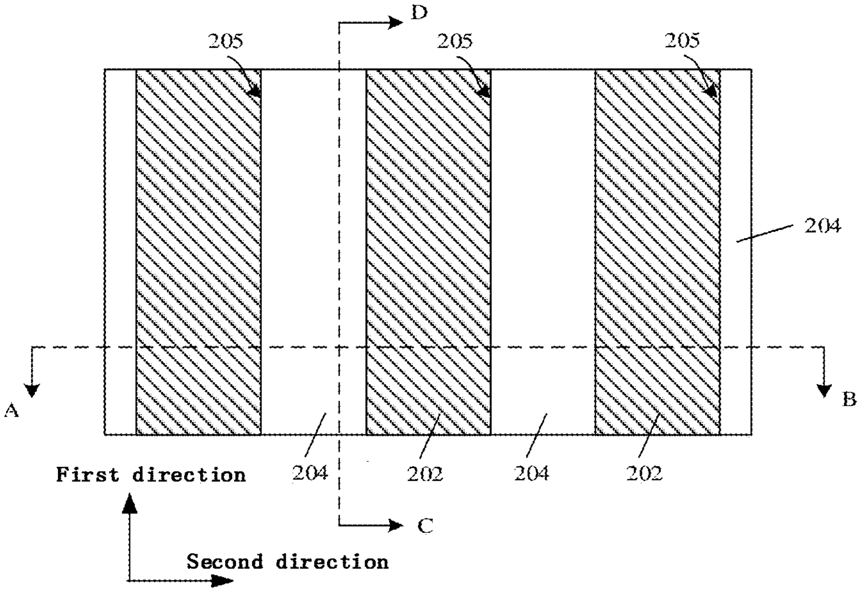

With reference to FIG. 2 and FIG. 3, FIG. 2 is a schematic cross-sectional view taken along a cutting line AB shown in FIG. 3. The first material layer 203 (with reference to FIG. 1) is patterned, so as to form a plurality of first strip structures 204 extending along the first direction and arranged parallel to each other on the first hard mask layer 202.

Each first strip structure 204 is in the shape of a strip. The plurality of first strip structures 204 are discrete and parallel to each other. An opening 205 is provided between any two of the first strip structures 204 adjacent to each other.

In some embodiments, the first material layer 203 is patterned through an anisotropic dry etching process, in particular an anisotropic plasma etching process.

In some embodiments, before the first material layer 203 is patterned, a patterned photoresist layer (not shown in the figure) may also be formed on the first material layer 203. The first material layer 203 is etched by using the patterned photoresist layer as a mask, so as to form the plurality of first strip structures 204. The patterned photoresist layer is removed.

Figure 4:
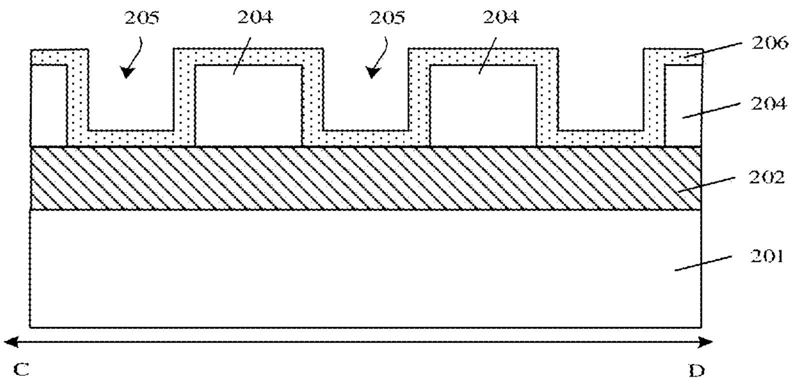

With reference to FIG. 4, a first sacrificial spacer layer 206 is formed on side walls and top surfaces of the plurality of first strip structures 204 and on a surface of the first hard mask layer 202 between the plurality of first strip structures 204.

The material of the first sacrificial spacer layer 206 is different from the material of the first strip structure 204, and the material of the first sacrificial spacer layer 206 may be one or more of polysilicon, amorphous silicon, amorphous carbon, silicon nitride, silicon oxynitride, silicon oxide, silicon nitride carbide, silicon oxycarbide, silicon carbide, and silicon germanium. The first sacrificial spacer layer 206 is formed through a deposition process, which includes an atomic layer deposition process.

Figure 5:
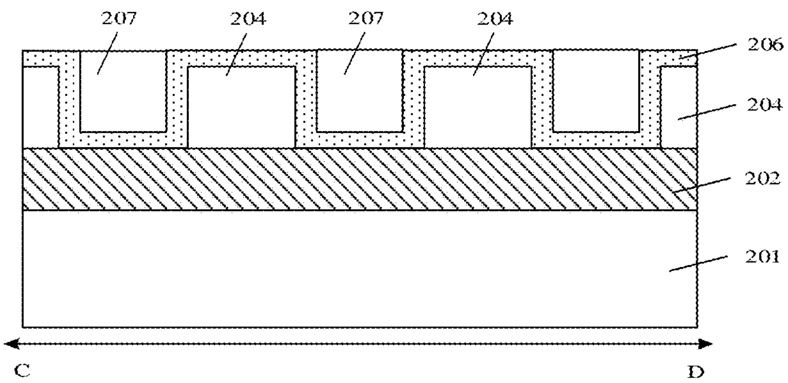

With reference to FIG. 5, a first filling layer 207 is filled between the plurality of first strip structures 204.

The first filling layer 207 is arranged on the surface of the first sacrificial spacer layer 206 between the first strip structures 204 and fills the openings between the first strip structures 204.

Subsequently, by removing the first sacrificial spacer layer 206 on surfaces of the side walls of the first strip structures 204, a plurality of fourth openings are formed between the first strip structures 204 and the first filling layer 207.

The material of the first filling layer 207 is different from the material of the first sacrificial spacer layer 206. In some embodiments, the material of the first filling layer 207 may be one or more of polysilicon, amorphous silicon, amorphous carbon, silicon nitride, silicon oxynitride, silicon oxide, silicon nitride carbide, silicon oxycarbide, silicon carbide, silicon germanium, and organic materials. The formation process of the first filling layer 207 may be an atmospheric or low pressure chemical vapor deposition (CVD) process, a plasma enhanced chemical vapor deposition (PECVD) process, a thermal chemical vapor deposition (Thermal CVD) process, a physical vapor deposition (PVD) process, an atomic layer deposition (ALD) process, a sputtering process, a plating process, an electroplating process, a spin coating process or other suitable processes, and/or a combination thereof.

In some embodiments, the surface of the formed first filling layer 207 may be flush with the first sacrificial spacer layer 206 on the top surfaces of the first strip structures 204. Specifically, after a first filling material layer covering the first sacrificial spacer layer 206 and filling the remaining openings between the first strip structures 204 is formed, the first filling layer above the surface of the first sacrificial spacer layer 206 on the top surfaces of the first strip structures 204 is remove through a chemical mechanical mask process, so that the first filling material layer remaining in the openings is formed as the first filling layer 207.

In some embodiments, the surface of the formed first filling layer may be flush with the top surfaces of the first strip structures 204. Specifically, after a first filling material layer covering the first sacrificial spacer layer 206 and filling the remaining openings between the first strip structures 204 is formed, the first sacrificial spacer layer 206 and the first filling material layer above the top surfaces of the first strip structures 204 are removed through the chemical mechanical mask process, so as to expose the top surfaces of the first strip structures 204, and the first filling material layer remaining in the openings is formed as the first filling layer. Therefore, the top surface of the formed first filling layer is flush with the top surfaces of the first strip structures. Subsequently, after the third openings are formed, when the first hard mask layer is etched, the etching load effect caused by the height difference between the filling layer and the first strip structures can be reduced, the accuracy of the position and the dimension of the formed first mask patterns can be improved, and a better side wall profile can be maintained, so that the accuracy of the position and the dimension of the block mask patterns formed after the first mask patterns are disconnected from each other is relatively high, and a better side wall profile is maintained, thereby allowing the accuracy of the position and the dimension of the active areas formed by etching the semiconductor substrate by using the block mask patterns as masks to be relatively high, and maintaining a better side wall profile.

Figure 6:
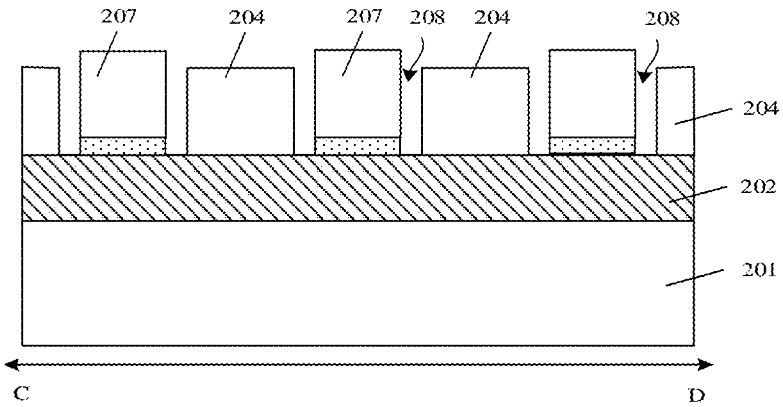

With reference to FIG. 6, the first sacrificial spacer layer on the surfaces of the side walls of the first strip structures 204 is removed, so as to form a plurality of fourth openings 208 between the first strip structures 204 and the first filling layer 207.

In some embodiments, the first sacrificial spacer layer on the surfaces of the side walls of the first strip structures 204 is removed through an anisotropic dry etching process, which includes an anisotropic plasma etching process.

It should be noted that, in some embodiments, when the first sacrificial spacer layer on the surfaces of the side walls of the first strip structures 204 is removed, the first sacrificial spacer layer on the top surfaces of the first strip structures 204 is also removed.

Figure 7:
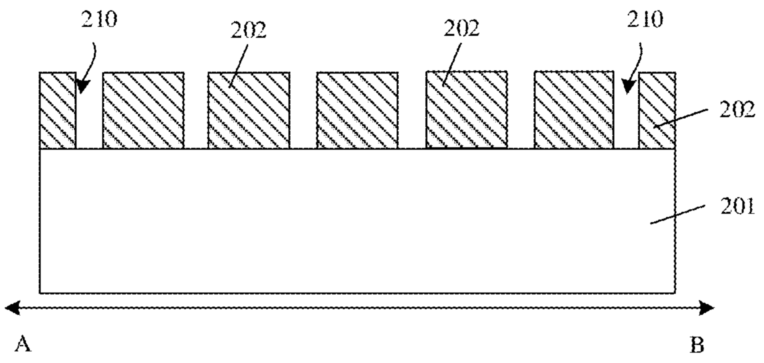
Figure 8:
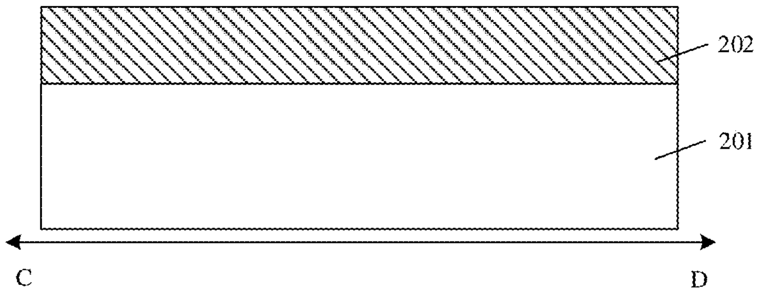
Figure 9:
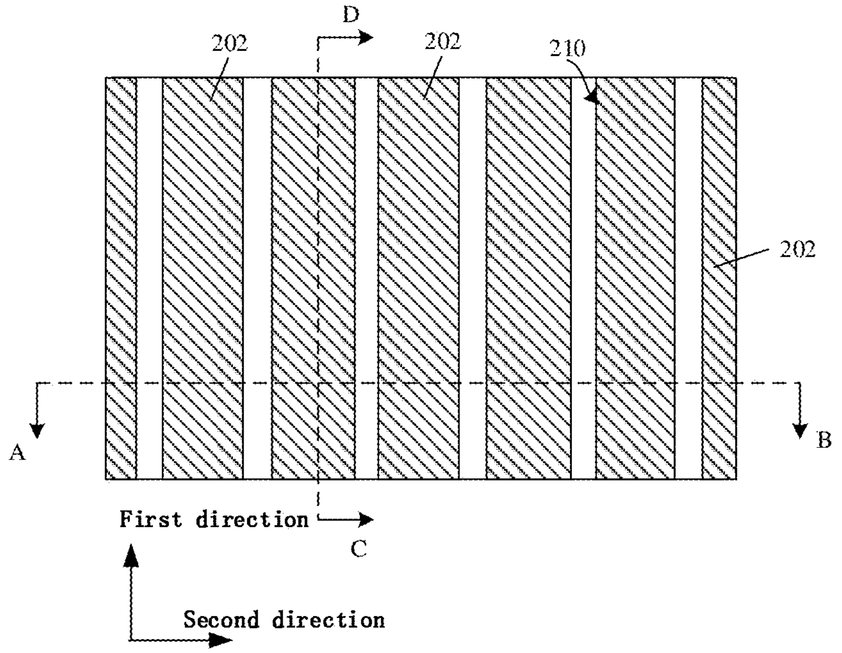

With reference to FIG. 7 to FIG. 9, FIG. 7 is a schematic cross-sectional view taken along a cutting line AB shown in FIG. 9, and FIG. 8 is a schematic cross-sectional view taken along a cutting line CD shown in FIG. 9. The first hard mask layer 202 is etched along the plurality of fourth openings, so as to form a plurality of first openings 210 extending along the first direction in the first hard mask layer 202.

In some embodiments, the first hard mask layer 202 is etched through an anisotropic dry etching process, which includes an anisotropic plasma etching process.

The first openings 210 described in the disclosure are formed through the above-mentioned self-aligned double patterning process. When the active areas are subsequently formed, the width of each of the first trenches which are arranged between the active areas and correspond to the first openings may be smaller, so that the areas of the active areas may be larger.

Figure 10:
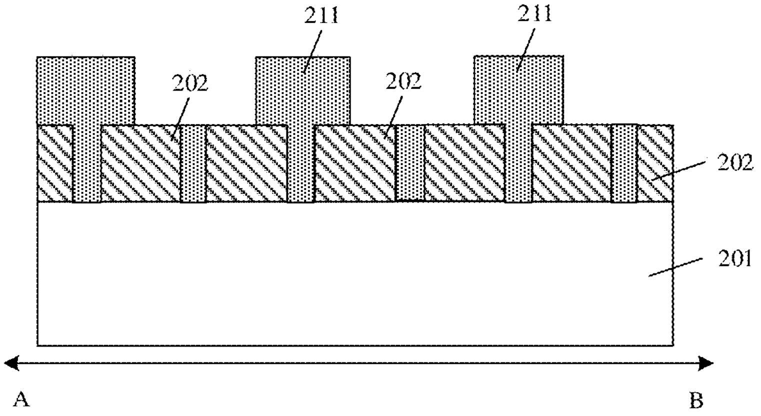

With reference to FIG. 10, the operation shown in FIG. 10 is performed on the basis of the operation shown in FIG. 7, in which a second filling layer filling the plurality of first openings is formed, and a plurality of second strip structures 211 extending along the first direction and arranged parallel to each other are formed on the second filling layer. Each of the plurality of second strip structures 211 covers the second filling layer in a respective one of the plurality of first openings and a portion of the first hard mask layer 202 on both sides of the respective one of the plurality of first openings, and a second filling layer filled in one of the openings is exposed between two adjacent second strip structures 211.

In some embodiments, the second filling layer and the second strip structures 211 are formed in the same operation, which specifically includes the following operations. A second material layer is formed on the surface of the first hard mask layer 202, in which the second material layer fills the first openings. A portion of the second material layer is removed by etching, so as to form a plurality of second strip structures 211 and the second filling layer filling the first openings.

The materials of the second filling layer and the second strip structures 211 are different from the material of the first hard mask layer 202. In some embodiments, the materials of the second filling layer and the second strip structures 211 may be one or more of polysilicon, amorphous silicon, amorphous carbon, silicon nitride, silicon oxynitride, silicon oxide, silicon nitride carbide, silicon oxycarbide, silicon carbide, silicon germanium, and the organic materials.

Figure 11:
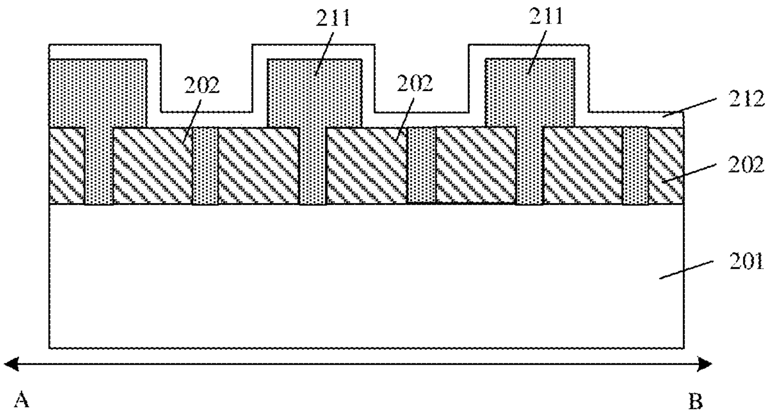

With reference to FIG. 11, a second sacrificial spacer layer 212 is formed on side walls and top surfaces of the plurality of second strip structures 211 and on the surfaces of the first hard mask layer 202 and the first filling layer between the plurality of second strip structures 211.

The material of the second sacrificial spacer layer 212 is different from the material of each second strip structure 211. In some embodiments, the material of the second sacrificial spacer layer 212 may be one or more of polysilicon, amorphous silicon, amorphous carbon, silicon nitride, silicon oxynitride, silicon oxide, silicon nitride carbide, silicon oxycarbide, silicon carbide, and silicon germanium. The second sacrificial spacer layer 212 is formed through a deposition process, which includes an atomic layer deposition process.

Figure 12:
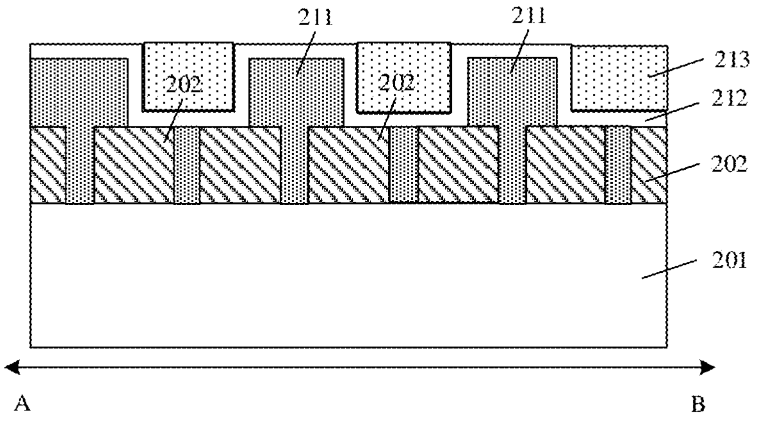

With reference to FIG. 12, a third filling layer 213 is filled between the plurality of second strip structures 211.

The third filling layer 213 is arranged on the second sacrificial spacer layer 212 between the second strip structures 211 and fills the spaces between the second strip structures 211.

Subsequently, the second sacrificial spacer layer on surfaces of the side walls of the plurality of second strip structures 211 is removed, so as to form a plurality of fifth openings between the plurality of second strip structures 211 and the third filling layer 213.

The material of the third filling layer 213 is different from the material of the second sacrificial spacer layer 212. In some embodiments, the material of the third filling layer 213 may be one or more of polysilicon, amorphous silicon, amorphous carbon, silicon nitride, silicon oxynitride, silicon oxide, silicon nitride carbide, silicon oxycarbide, silicon carbide, silicon germanium, and the organic materials. The formation process of the third filling layer 213 may be an atmospheric or low pressure chemical vapor deposition (CVD) process, a plasma enhanced chemical vapor deposition (PECVD) process, a thermal chemical vapor deposition (Thermal CVD) process, a physical vapor deposition (PVD) process, an atomic layer deposition (ALD) process, a spurting process, a plating process, an electroplating process, a spin coating process or other suitable processes, and/or a combination thereof.

Figure 13:
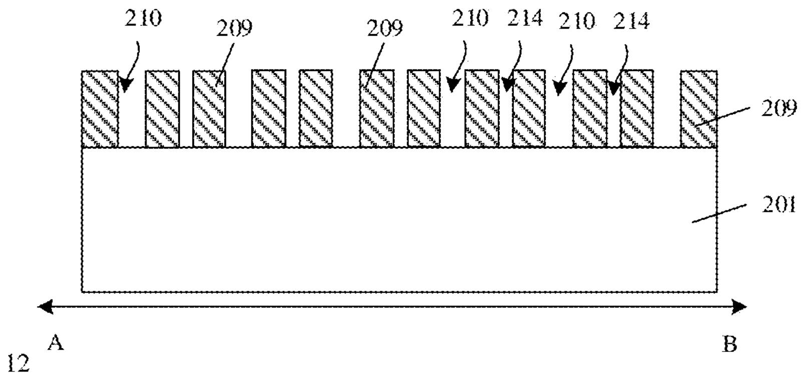
Figure 14:
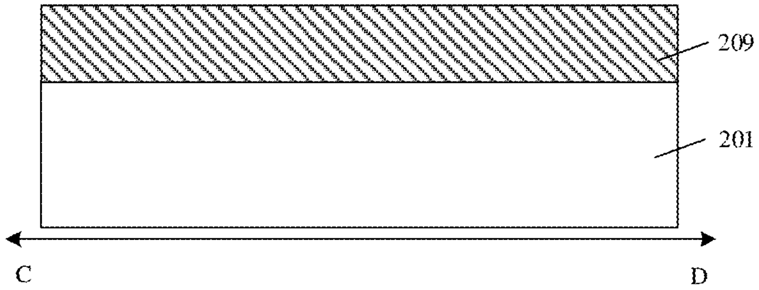
Figure 15:
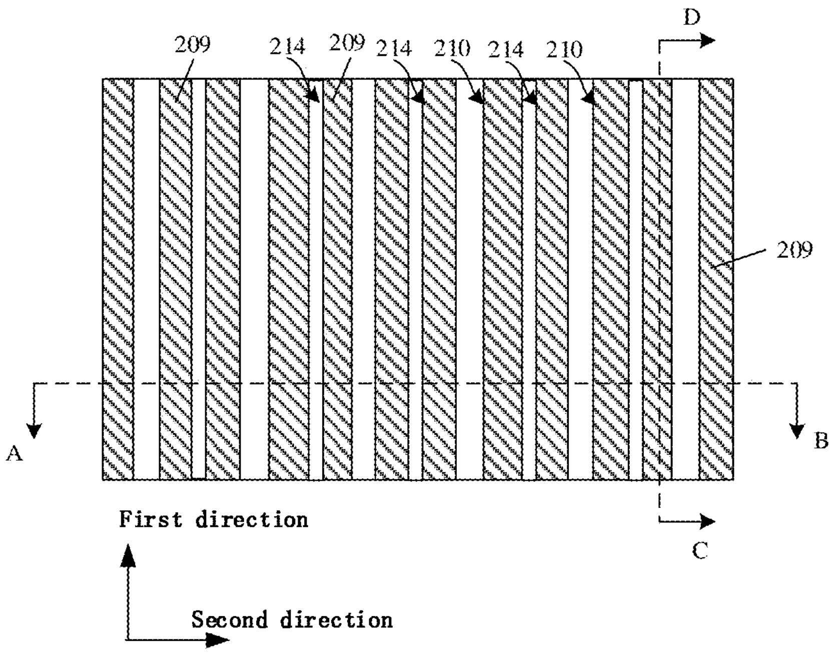

With reference to FIG. 13 to FIG. 15, FIG. 13 is a schematic cross-sectional view taken along a cutting line AB shown in FIG. 15, and FIG. 14 is a schematic cross-sectional view taken along a cutting line CD shown in FIG. 15. The second sacrificial spacer layer 212 (with reference to FIG. 12) on surfaces of the side walls of the plurality of second strip structures 211 is removed, so as to form a plurality of fifth openings between the plurality of second strip structures 211 and the third filling layer 213, in which a width of each of the plurality of fifth openings is less than a width of each of the plurality of fourth openings. The first hard mask layer between the plurality of first openings 210 is etched along the plurality of fifth openings, so as to form the plurality of second openings 214 in the first hard mask layer, in which the width of each of the plurality of second openings 214 is less than the width of each of the plurality of first openings 210, the plurality of second openings 214 and the plurality of first openings 210 are alternately distributed, and a remaining portion of the first hard mask layer between the plurality of second openings 214 and the plurality of first openings 210 is formed as the plurality of first mask patterns 209.

In some embodiments, the first hard mask layer 202 is etched through an anisotropic dry etching process, which includes an anisotropic plasma etching process.

The plurality of formed first mask patterns 209 are discrete. Specifically, the formed first mask patterns 209 extend along the first direction and are arranged parallel to each other, and first openings 210 and second openings 214 are alternately distributed between the adjacent first mask patterns 209.

A width of each formed second opening 214 is less than a width of each first opening 210. Subsequently, when the semiconductor substrate 201 is etched in the same etching process, the etching rate of the semiconductor substrate at the bottom portions of the second openings 214 is higher than the etching rate of the semiconductor substrate at the bottom portions of the first openings, so that the depth of each second trench correspondingly formed in the semiconductor substrate 201 is less than the depth of each first trench, thereby simplifying the formation processes of the first trenches and the second trenches, while allowing the dimensions of the formed first trenches and the formed second trenches to be smaller.

The first mask patterns 209 described above in the disclosure are formed through the above-mentioned self-aligned double patterning process. When the active areas are subsequently formed, the width of each first trench between the active areas and the width of each second trench between the active areas may be smaller, so that the areas of the active areas may be larger.

Figure 16:
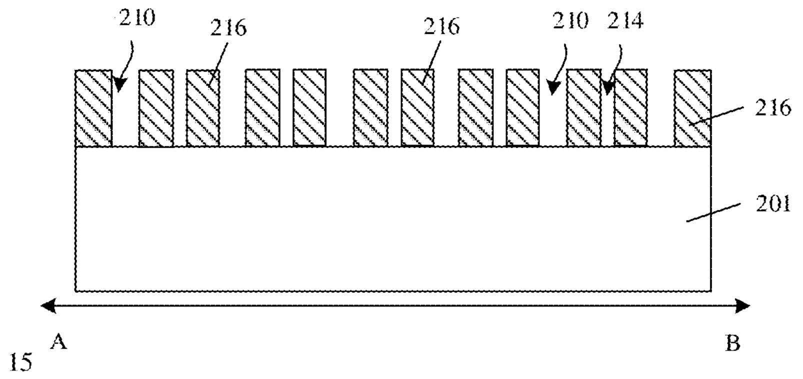
Figure 17:
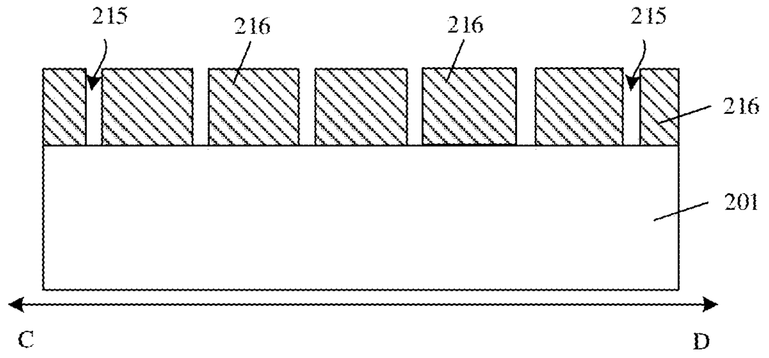
Figure 18:
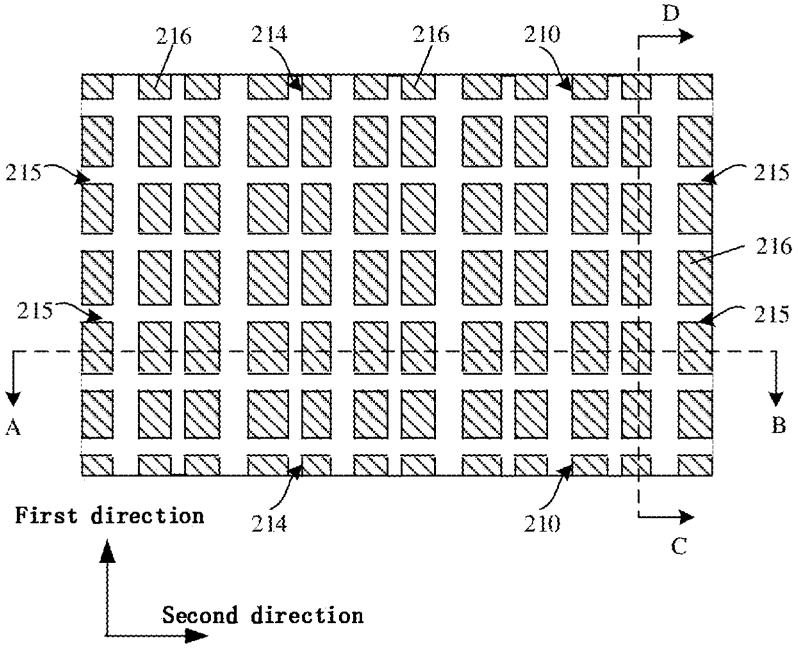

After the plurality of first mask patterns 209 arranged parallel to each other and extending along the first direction are formed on the semiconductor substrate 201, in which a plurality of first openings 210 and a plurality of second openings 214 are alternately distributed between any two of the plurality of first mask patterns 209 adjacent to each other, and a width of each of the plurality of first opening 210 is greater than a width of each of the plurality of second opening 214, the method further includes the following operations. A plurality of second mask patterns arranged parallel to each other and extending along the second direction are formed on the plurality of first mask patterns 209, in which a plurality of sixth openings are provided between any two of the plurality of second mask patterns adjacent to each other, and the second mask patterns are also formed through the self-aligned double patterning process. The plurality of first mask patterns are etched along the plurality of sixth openings by using the plurality of second mask patterns as masks, so as to form a plurality of third openings 215 extending along the second direction in the plurality of first mask patterns, in which a remaining portion of the plurality of first mask patterns is formed as a plurality of discrete etching masks 216 (with reference to FIG. 16 to FIG. 18, FIG. 16 is a schematic cross-sectional view taken along a cutting line AB shown in FIG. 18, and FIG. 17 is a schematic cross-sectional view taken along a cutting line CD shown in FIG. 18).

With reference to FIG. 19 to FIG. 21, the semiconductor substrate 201 is etched by using the plurality of etching masks as masks, so as to form the plurality of first trenches 217 corresponding to the plurality of first openings, the plurality of second trenches 218 corresponding to the plurality of second openings, and the plurality of third trenches 219 corresponding to the plurality of third openings in the semiconductor substrate 201. A plurality of areas between the plurality of first trenches 217, the plurality of second trenches 218, and plurality of the third trenches 219 are formed as the plurality of active areas 220. The plurality of first trenches 217 and the plurality of second trenches 218 communicate with the plurality of third trenches 219. The depth of each of the plurality of second trenches 218 is less than the depth of each of the plurality of first trenches 217, and the depth of the region of each of the plurality of third trenches 219 other than the communication region of each of the plurality of third trenches 219 with each of the plurality of second trenches 218 is greater than the depth of each of the plurality of second trenches 218.

The semiconductor substrate 201 is etched through an anisotropic dry etching process, which includes an anisotropic plasma etching process.

The etching masks may be removed simultaneously during etching of the semiconductor substrate, or may be removed through an additional etching process after the active areas are formed.

Figure 22:
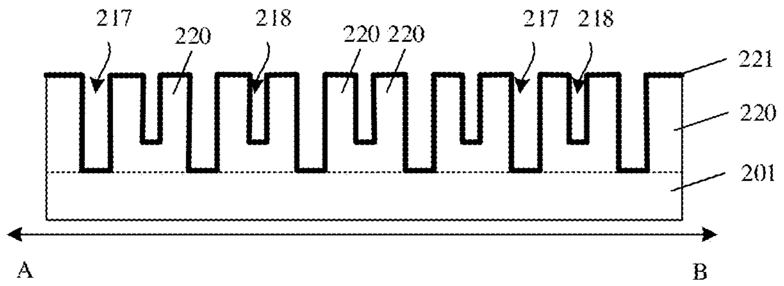
Figure 23:
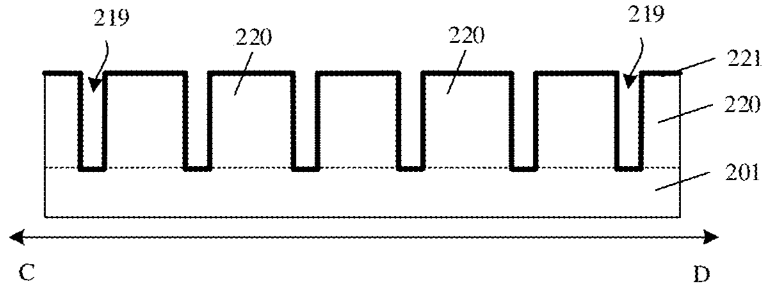

With reference to FIG. 22 and FIG. 23, the operation shown in FIG. 22 is performed on the basis of the operation shown in FIG. 19, and the operation shown in FIG. 23 is performed on the basis of the operation shown in FIG. 20, in which a protective layer 221 is formed on side walls and bottom surfaces of the plurality of first trenches 217, side walls and bottom surfaces of the plurality of third trenches 219, and side walls and bottom surfaces of the plurality of second trenches 218.

The protective layer 221 protects the surfaces of the side walls of the active areas 220 during subsequent ion implantation.

In some embodiments, the material of the protective layer 221 may be silicon oxide. The protective layer 221 is formed through an oxidation process, which may specifically be furnace oxidation.

Figure 24:
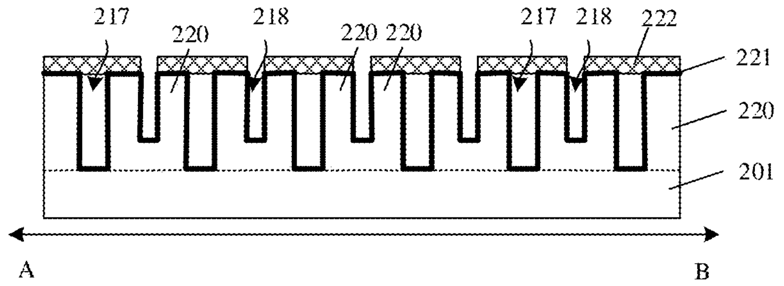
Figure 25:
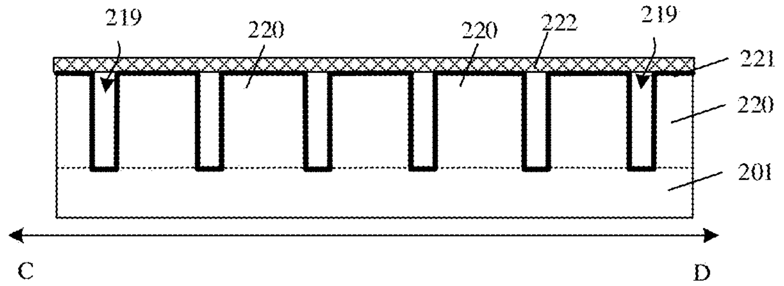

With reference to FIG. 24 and FIG. 25, after the protective layer 221 are formed, a mask layer 222 is formed on the surface of the semiconductor substrate 201, in which the mask layer 222 is provided with a plurality of openings exposing the semiconductor substrate 201 at the bottom portion of each of the plurality of second trenches 218 and at the bottom portion of the communication region of each of the plurality of third trenches 219 with each of the plurality of second trenches 218.

The mask layer 222 may have a single-layer structure or a multi-layer stack structure (for example, a double-layer stack structure). In some embodiments, the mask layer 222 may include a hard mask material layer and a photoresist layer arranged on the surface of the hard mask material layer. The material of the hard mask material layer may be one or more of silicon nitride, silicon oxynitride, silicon oxide, silicon nitride carbide, and silicon oxycarbide.

Figure 26:
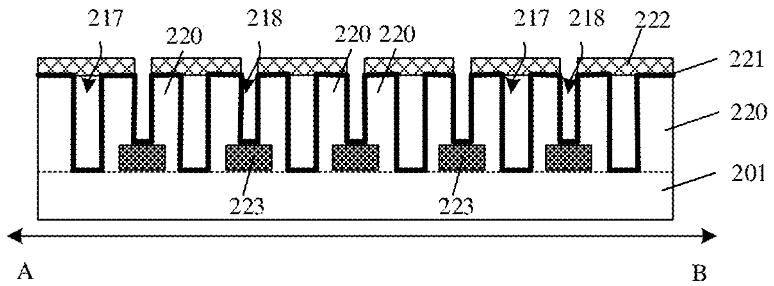
Figure 27:
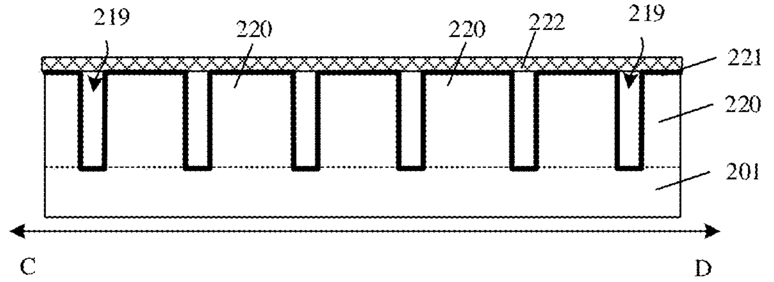

With reference to FIG. 26 and FIG. 27, the first ion implantation process is performed on the semiconductor substrate 201 at the bottom portions of the plurality of second trenches 218 and at the bottom portions of the communication regions of the plurality of third trenches 219 with the plurality of second trenches 218 along the plurality of openings by using the mask layer 222 as a mask, so as to form bit line doped areas 223 in the semiconductor substrate 201 at the bottom portions of the plurality of second trenches 218 and at the bottom portions of the communication regions of the plurality of third trenches 219 with the plurality of second trenches 218.

The bit line doped areas 223 are formed through the first ion implantation, and the type of impurity ions implanted into the bit line doped areas 223 is different from the type of impurity ions implanted into well area of the active areas 220. For example, when P-type impurity ions are implanted into the well area of the active areas 220, N-type impurity ions are implanted into the bit line doped areas 223; and when N-type impurity ions are implanted into the well area of the active areas 220, P-type impurity ions are implanted into the bit line doped areas 223. The impurity ions implanted into the bit line doped areas 223 are N-type impurity ions or P-type impurity ions. The P-type impurity ions are one or more of boron ions, gallium ions or indium ions, and the N-type impurity ions are one or more of phosphorus ions, arsenic ions or antimony ions.

In some embodiments, after the first ion implantation is performed, it is necessary to perform an annealing process to activate the doped ions.

In some embodiments, the width of the formed bit line doped area 223 is greater than or equal to the width of the bottom portion of each of the plurality of second trenches 218, and the bottom portion of the bit line doped area 223 is flush with the bottom portion of each first trench 217 or higher than the bottom portion of each first trench 217 (the bottom portion of the bit line doped area 223 is closer to the surface of the active area 220 than the bottom portion of each first trench 217).

The portion of the bit line doped area 223 in contact with the active area 220 is formed as a drain area of the vertical transistor. There are two active areas 220 between two adjacent first openings 210. The vertical transistor formed in these two active areas 220 share one drain area, so as to improve the integration of the device. In addition, each bit line doped area 223 electrically connects the drain areas in each two adjacent rows of vertical transistors with each other along the first direction, so as to improve the control capability of the vertical transistors, thereby improving the operational capabilities (reading, writing, and deleting) of the subsequently formed memory.

Figure 28:
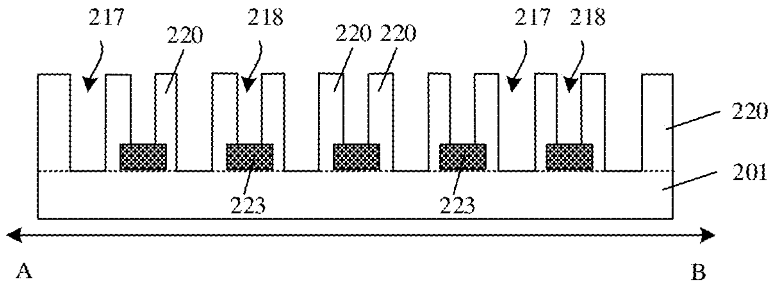
Figure 29:
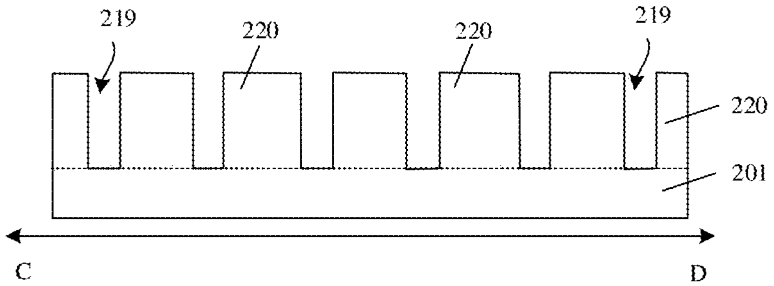

In some embodiments, with reference to FIG. 28 and FIG. 29, after the bit line doped areas 223 are formed, the protective layer 221 and the mask layer 222 are removed.

The protective layer 221 and the mask layer 222 are removed through a wet etching process.

Figure 30:
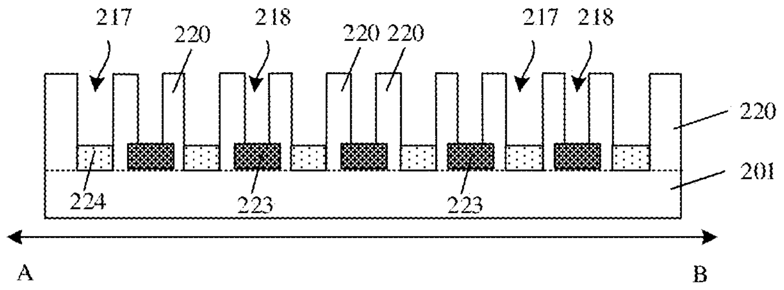
Figure 31:
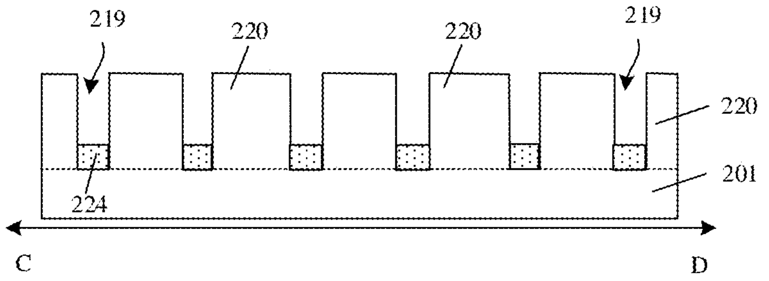

With reference to FIG. 30 and FIG. 31, a first isolation layer 224 is formed in each of the plurality of first trenches 217 and each of the plurality of third trenches 219, in which a surface of the first isolation layer 224 is lower than the surface of each of the plurality of active areas 220.

The first isolation layer 224 is configured for creating electrical isolation between the adjacent active areas and between the adjacent bit line doped areas 223. In some embodiments, the material of the first isolation layer 224 is silicon oxide, silicon nitride, silicon oxynitride, fluorine-doped silicon glass (FSG), low dielectric constant (where K is less than 2.8) materials, or other suitable materials, and/or a combination thereof.

In some embodiments, the formation process of the first isolation layer 224 includes the following operations. A first isolation material layer is formed on the surfaces of the active areas 220 and in the first trenches 217, the second trenches 218, and the third trenches 219 through a deposition process. A portion of the first isolation material layer is etched back, so as to form the first isolation layer 224 in the first trenches 217 and the third trenches 219.

Figure 32:
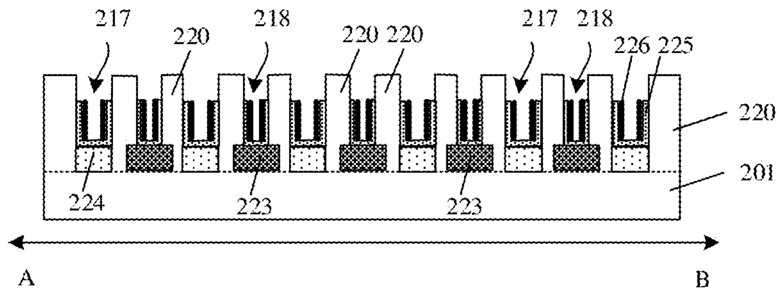
Figure 33:
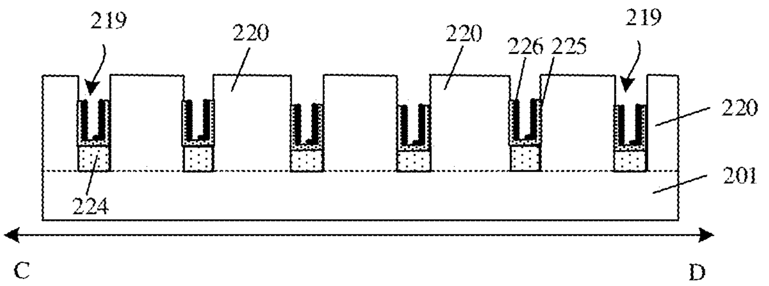

With reference to FIG. 32 and FIG. 33, a gate dielectric layer 225 surrounding the plurality of active areas 220 is formed on the surfaces of the plurality of active areas 220; and a plurality of metal gates 226 surrounding the plurality of active areas 220 are formed on a surface of the gate dielectric layer 225 arranged on side walls of the plurality of active areas 220, in which a top surface of each of the plurality of metal gates 226 is lower than a top surface of each of the plurality of active areas 220.

The material of the gate dielectric layer 225 may be silicon oxide or a high-K (dielectric constant) dielectric material. The high-K dielectric material is one or more of $HfO_2$, $TiO_2$, HfZrO, HfSiNO, $Ta_2O_5$, $ZrO_2$, $ZrSiO_2$, $Al_2O_3$, $SrTiO_3$, or BaSrTiO.

The gate dielectric layer 225 may be formed through an oxidation or deposition process.

In some embodiments, the gate dielectric layer 225 may be formed after the protective layer 221 is removed. In another embodiment, the gate dielectric layer may be directly formed on the protective layer 236 without removing the protective layer 236.

In some embodiments, when the gate dielectric layer 225 is formed, the gate dielectric layer 225 may also be formed on the bottom surfaces of the first trenches, the second trenches and the third trenches, and on the top surfaces of the active areas.

The formed metal gate 226 surrounds the side wall of each active area, and the top surface of the metal gate 226 is lower than the top surfaces of the active areas 220, so that the control capability of the metal gates 226 for controlling the formation of channels in the side walls of the active areas can be improved, and the performance of forming the vertical transistors can be improved.

In some embodiments, the material of the metal gate 226 may be one or more of W, Al, Cu, Ag, Au, Pt, Ni, Ti, TiN, TaN, Ta, TaC, TaSiN, WN, and Wsi.

In some embodiments, the formation process of the metal gates 226 includes the following operations. A metal layer is formed on the surface of the gate dielectric layer and the surface of the first isolation layer. Excess metal layer is removed through maskless etching, so as to form the metal gates 226 surrounding the plurality of active areas on the surface of the gate dielectric layer arranged on the side walls of the plurality of active areas. In this process, there is no electrical connection between the metal gates 226 on the side walls of adjacent active areas 220, and thus the plurality of metal gates 226 are discrete. A plurality of conductive connection structures that electrically connects the plurality of metal gates arranged in each row in the second direction may be formed subsequently, and the metal gates in the adjacent rows are still disconnected from each other, so as to improve the control capability of the vertical transistors, thereby improving the operational capabilities (reading, writing, and deleting) of the subsequently formed memory.

In some other embodiments, the formation process of the metal gates includes the following operations. A metal layer filling the plurality of first trenches, the plurality of third trenches and the plurality of second trenches is formed on the surface of the gate dielectric layer and on the surface of the first isolation layer. The metal layer is etched back, so as to allow a top surface of the metal layer to be lower than the top surface of each of the plurality of active areas. After the metal layer is etched back, the metal layer filling the plurality of third trenches is cut along the second direction, so as to form the plurality of metal gates surrounding the plurality of active areas on the surface of the gate dielectric layer arranged on the side walls of the plurality of active areas. For the metal gates formed in this manner, the plurality of metal gates arranged in each row in the second direction are connected with each other, and the metal gates arranged in the adjacent rows in the second direction are disconnected from each other.

Figure 34:
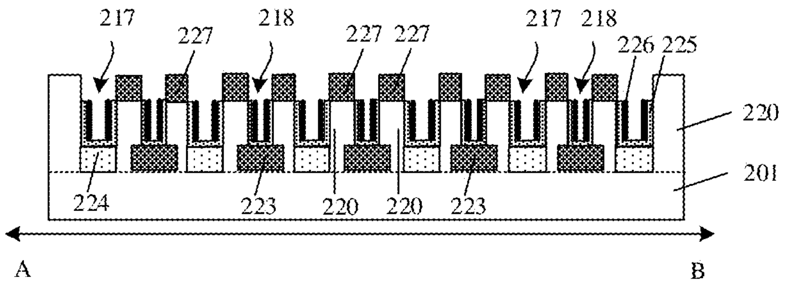
Figure 35:
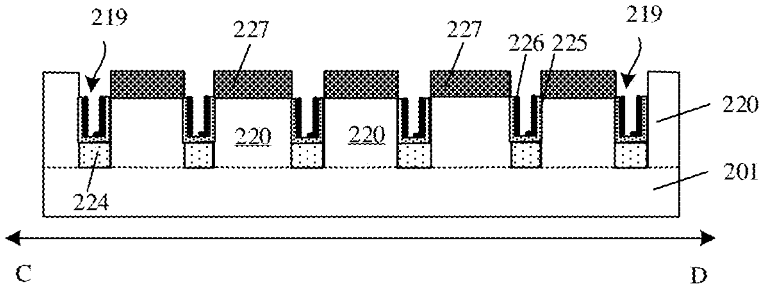

With reference to FIG. 34 and FIG. 35, a source area 227 is formed on the top surface of each of the plurality of active areas 220.

The type of impurity ions doped in the source area 227 is the same as the type of impurity ions doped in the bit line doped areas 223, but is different from the type of impurity ions doped in the well area of the active areas. The source area 227 is formed through a second ion implantation process. The impurity ions implanted into (doped in) the source area 227 are N-type impurity ions or P-type impurity ions. The P-type impurity ions are one or more of boron ions, gallium ions or indium ions, and the N-type impurity ions are one or more of phosphorus ions, arsenic ions or antimony ions.

Figure 36:
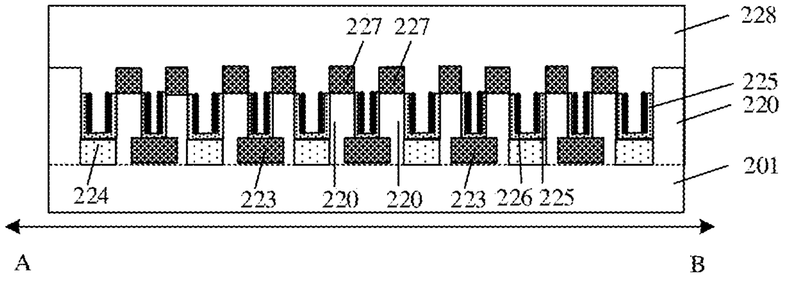
Figure 37:
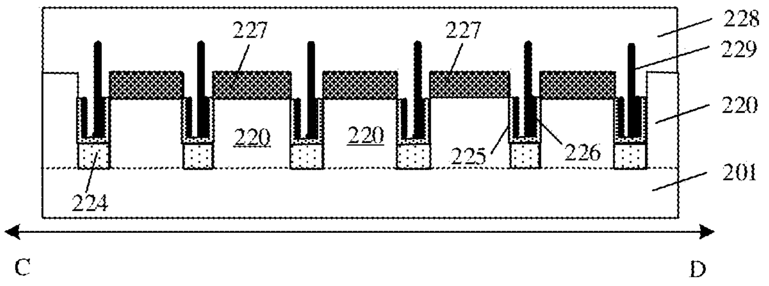

In some embodiments, with reference to FIG. 36 and FIG. 37, after the plurality of discrete metal gates 226 are formed, a second isolation layer 228 covering the metal gates 226 and filling the first trenches, the third trenches and the second trenches is formed. A plurality of conductive connection structures extending along the second direction and configured to connect the plurality of metal gates 226 with each other are formed in the second isolation layer 228 in the third trenches.

In some embodiments, in a case that the plurality of formed metal gates arranged in each row in the second direction are initially connected with each other, and the metal gates arranged in the adjacent rows in the second direction are disconnected from each other, the second isolation layer filling the first trenches, the third trenches and the second trenches are directly formed without additional formation of the conductive connection structures.

In the disclosure, a plurality of vertical transistors are formed through the above-mentioned process. Each vertical transistor includes a respective active area 220, a gate dielectric layer 225 arranged on the surface of the side wall of the active area 220, a bit line doped area 223 arranged in the semiconductor substrate at the bottom portion of the second trench, a source area 227 arranged on the top surface of the active area 220, and a metal gate 226 arranged on the surface of the gate dielectric layer on the side wall of the first trench, the second trench, and the third trench and surrounding the active area 220. In the vertical transistor of the specific structure described above, since the source area and the drain area are arranged on the upper and lower sides of the active area, the formed channel area is arranged on the side wall of the active area, so that an area of the semiconductor substrate occupied by the vertical transistor is relatively small, the number of the vertical transistors formed in the unit area can be increased, and the number of the capacitors that are subsequently formed in the unit area and connected to the source area of each transistor can also be increased accordingly, thereby improving the storage capacity and the storage density of the memory. In addition, the vertical transistor of such a specific structure can reduce the body effect, and reduce the leakage current generated by the subsequently formed capacitor into the substrate, thereby improving the electrical performance of the storage device.

In some embodiments, after the source area 227 is formed, the method further includes the following operation. A capacitor connected to the source area 227 is formed on the surface of the semiconductor substrate 201.

In some embodiments, the operation that the capacitor connected to the source area is formed on the surface of the semiconductor substrate includes the following operations. A first dielectric layer is formed on the semiconductor substrate. A plurality of through holes exposing a surface of the source area are formed in the first dielectric layer. A contact plug is formed in each of the plurality of through holes. A second dielectric layer is formed on the first dielectric layer. A capacitor hole exposing the contact plug is formed in the second dielectric layer. The capacitor is formed in the capacitor hole.

Figure 38:
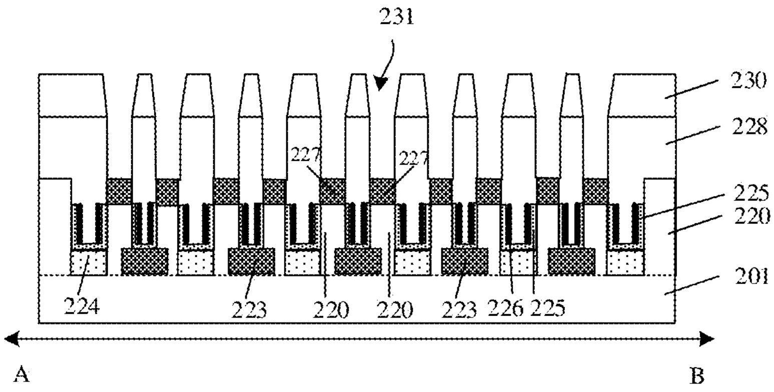
Figure 39:
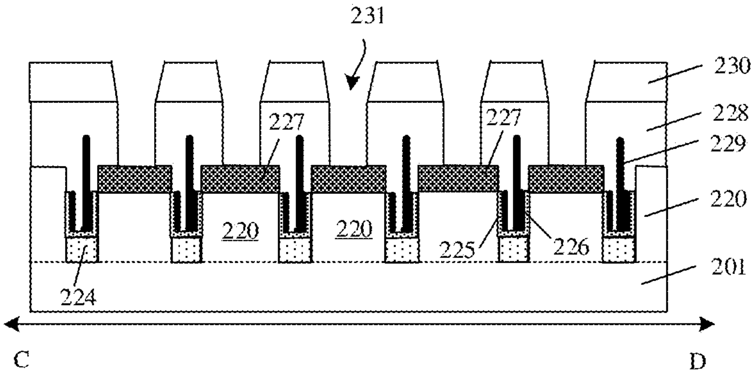
Figure 40:
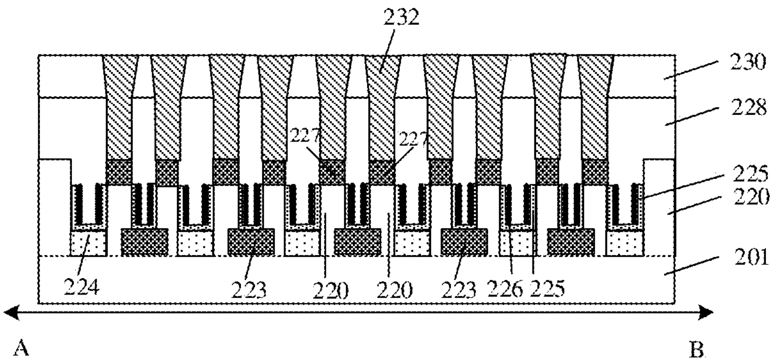
Figure 41:
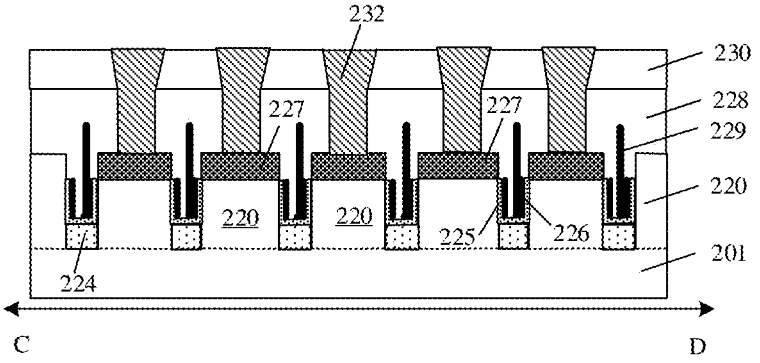
Figure 42:
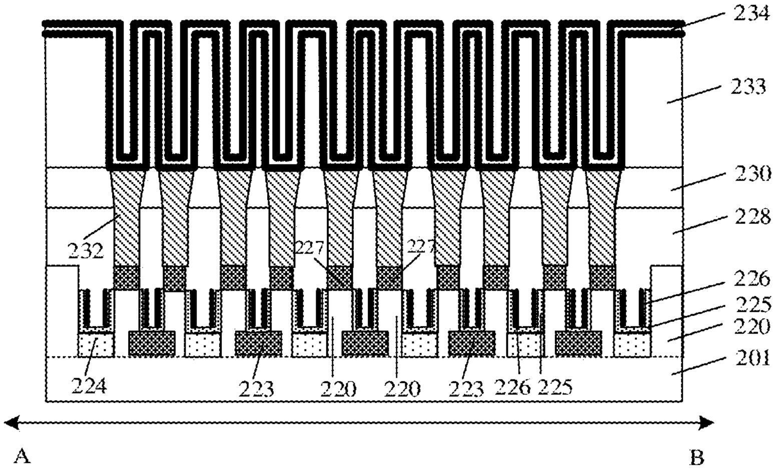
Figure 43:
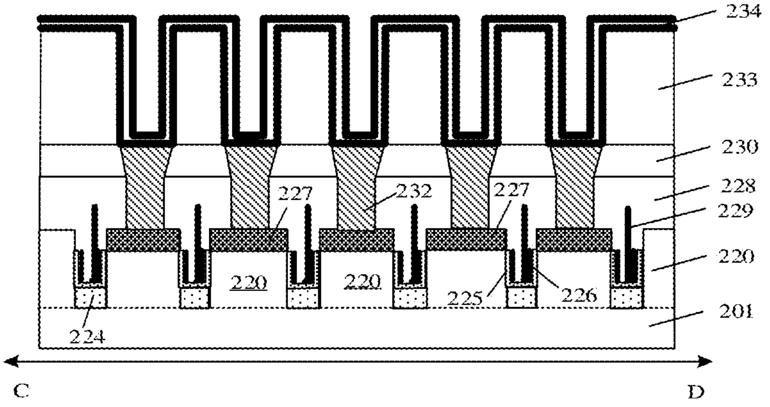

In some embodiments, the operation that the capacitor connected to the source area 227 is formed on the surface of the semiconductor substrate 201 includes the following operations. With reference to FIG. 38 and FIG. 39, a first dielectric layer 230 is formed on the second isolation layer 228. A plurality of through holes 231 exposing the surface of the source area 227 are formed in the first dielectric layer 230 and the second isolation layer 228. In some embodiments, the openings of the formed through holes 231 may be widened toward both sides, so as to facilitate the subsequent formation of contact plugs, and to increase the contact area between the top surfaces of the formed contact plugs and the subsequently formed capacitors. With reference to FIG. 40 and FIG. 41, the contact plugs 232 are formed in the through holes, in which the material of the contact plug 232 is metal. With reference to FIG. 42 and FIG. 43, a third dielectric layer 233 is formed on the second dielectric layer 230. The capacitor holes exposing the contact plugs 232 are formed in the third dielectric layer 233. The capacitors 234 are formed in the capacitor holes.

In some embodiments, the capacitor 234 includes a lower electrode layer, a dielectric layer arranged on the lower electrode layer, and an upper electrode layer arranged on the dielectric layer.

In some embodiments, the material of the dielectric layer may be a high-K dielectric material, so as to improve the capacitance value of the capacitor per unit area. The high-K dielectric material includes one of $HfO_2$, $TiO_2$, HfZrO, HfSiNO, $Ta_2O_5$, $ZrO_2$, $ZrSiO_2$, $Al_2O_3$, $SrTiO_3$, or BaSrTiO, or a stack structure formed by two or more groups composed of the above materials.

In some embodiments, the materials of the upper electrode layer and the lower electrode layer may be one of tungsten, titanium, nickel, aluminum, platinum, titanium nitride, N-type polysilicon and P-type polysilicon, or a stack structure formed by two or more groups composed of the above materials, and may also include compounds formed by one or two of metal nitrides and metal silicides, such as titanium nitride, titanium silicide, nickel silicide, titanium silicon nitride ($TiSi_xN_y$), etc.

In some other embodiments, the capacitors may also be formed through an existing double-sided capacitor forming process.

Some embodiments of the disclosure further provide a storage device. With reference to FIG. 42 and FIG. 43 and with reference to FIG. 19 to FIG. 21, the storage device includes:

a semiconductor substrate 201, in which a plurality of active areas 220 are formed in the semiconductor substrate 201, the plurality of active areas 220 are spaced apart from each other by a plurality of first trenches 217 and a plurality of second trenches 218 extending along a first direction and a plurality of third trenches 219 extending along a second direction, the plurality of first trenches 217 and the plurality of second trenches 218 communicate with the plurality of third trenches 219, the plurality of first trenches 217 and the plurality of second trenches 218 are spaced apart from each other in the first direction, a depth of each of the plurality of second trenches 218 is less than a depth of each of the plurality of first trenches 217, and a depth of a region of each of the plurality of third trenches other than a communication region of each of the plurality of third trenches 219 with each of the plurality of second trenches 218 is greater than the depth of each of the plurality of second trenches 218;

a bit line doped area 223 arranged in the semiconductor substrate 201 at a bottom portion of each of the plurality of second trenches 218 and at a bottom portion of the communication region of each of the plurality of third trenches 219 with each of the plurality of second trenches 218;

a first isolation layer 224 arranged in each of the plurality of first trenches 217 and each of the plurality of third trenches 219, in which a surface of the first isolation layer 224 is lower than a surface of each of the plurality of active areas 220;

a gate dielectric layer 225 arranged on the surfaces of the plurality of active areas 220 and surrounding the plurality of active areas 220;

a plurality of metal gates 226 arranged on a surface of the gate dielectric layer 225 on side walls of the plurality of active areas 220 and surrounding the plurality of active areas 220, in which a top surface of each of the plurality of metal gates 226 is lower than a top surface of each of the plurality of active areas 220; and a source area 227 arranged on the top surface of each of the plurality of active areas 220.

In some embodiments, a width of the bit line doped area 223 is greater than or equal to a width of the bottom portion of each of the plurality of second trenches 218.

In some embodiments, impurity ions doped in the bit line doped area 223 are N-type impurity ions or P-type impurity ions.

In some embodiments, a type of impurity ions doped in the source area 227 is the same as a type of the impurity ions doped in the bit line doped area 223.

In some embodiments, the plurality of metal gates 226 are arranged on the surface of the gate dielectric layer on the side walls of the plurality of active areas and surround the plurality of active areas, and each of the plurality of first trenches, each of the plurality of third trenches, and each of the plurality of second trenches are partially filled with the plurality of metal gates 226.

In some embodiments, the storage device further includes a second isolation layer 228 covering the plurality of metal gates 226 and filling the plurality of first trenches, the plurality of third trenches, and plurality of the second trenches; and a plurality of conductive connection structures 229 arranged in the second isolation layer 228 in the plurality of third trenches, extending along the second direction, and configured to connect the plurality of metal gates with each other (with reference to FIG. 43).

In some other embodiments, the plurality of first trenches, the plurality of third trenches and the plurality of second trenches are completely filled with the plurality of metal gates, each of the plurality of metal gates is lower than the top surface of each of the plurality of active areas, and a portion of the plurality of metal gates in the plurality of third trenches is cut along the second direction.

In some embodiments, the storage device further includes a capacitor 234 arranged on the semiconductor substrate 201 and connected to the source area 227.

It should be noted that the limitations or descriptions of the same or similar structures in this embodiment (storage device) and the above embodiments (the method for forming the storage device) will not be repeated in this embodiment. For details, reference may be made to the limitations or descriptions in corresponding parts in the above embodiments.

Although some preferred embodiments are disclosed as above, it is not intended to limit the present disclosure. Any person skilled in the art may implement any possible changes or modifications to the technical solutions of the present disclosure by using the methods and technical contents disclosed above, without departing from the spirit and scope of the present disclosure. Therefore, any simple changes, equivalent changes and modifications to the above embodiments according to the technical essence of the present disclosure which does not depart from the technical solutions of the present disclosure will fall within the protection scope of the technical solutions of the present disclosure.

The invention claimed is:

1. A method for forming a storage device, comprising:

providing a semiconductor substrate, and forming a plurality of active areas in the semiconductor substrate, wherein the plurality of active areas are spaced apart from each other by a plurality of first trenches and a plurality of second trenches extending along a first direction and a plurality of third trenches extending along a second direction, the plurality of first trenches and the plurality of second trenches communicate with the plurality of third trenches, the plurality of first trenches and the plurality of second trenches are spaced apart from each other in the second direction, a depth of each of the plurality of second trenches is less than a depth of each of the plurality of first trenches, and a depth of a region of each of the plurality of third trenches other than a communication region of each of the plurality of third trenches with each of the plurality of second trenches is greater than the depth of each of the plurality of second trenches;

forming a bit line doped area in the semiconductor substrate at a bottom portion of each of the plurality of second trenches and at a bottom portion of the communication region of each of the plurality of third trenches with each of the plurality of second trenches;

forming a first isolation layer in each of the plurality of first trenches and each of the plurality of third trenches, wherein a surface of the first isolation layer is lower than a surface of each of the plurality of active areas;

forming a gate dielectric layer surrounding the plurality of active areas on surfaces of the plurality of active areas;

forming, on a surface of the gate dielectric layer arranged on side walls of the plurality of active areas, a plurality of metal gates surrounding the plurality of active areas, wherein a top surface of each of the plurality of metal gates is lower than a top surface of each of the plurality of active areas; and forming a source area on the top surface of each of the plurality of active areas;

wherein forming the plurality of metal gates comprises: forming a metal layer filling the plurality of first trenches, the plurality of third trenches and the plurality of second trenches on the surface of the gate dielectric layer and on the surface of the first isolation layer; etching back the metal layer to allow a top surface of the metal layer to be lower than the top surface of each of the plurality of active areas;

and after etching back the metal layer, cutting the metal layer filing the plurality of third trenches along the second direction to form the plurality of metal gates surrounding the plurality of active areas on the surface of the gate dielectric layer arranged on the side walls of the plurality of active areas.

2. The method for forming the storage device according to claim 1, wherein a width of the bit line doped area is greater than or equal to a width of the bottom portion of each of the plurality of second trenches.

3. The method for forming the storage device according to claim 2, wherein the bit line doped area is formed through a first ion implantation process, and impurity ions implanted through the first ion implantation process are N-type impurity ions or P-type impurity ions.

4. The method for forming the storage device according to claim 3, further comprising:

before performing the first ion implantation process, forming a protective layer on side walls and bottom surfaces of the plurality of first trenches, side walls and bottom surfaces of the plurality of third trenches, and side walls and bottom surfaces of the plurality of second trenches;

after forming the protective layer, forming a mask layer on a surface of the semiconductor substrate, wherein the mask layer is provided with a plurality of openings exposing the semiconductor substrate at the bottom portion of each of the plurality of second trenches and at the bottom portion of the communication region of each of the plurality of third trenches with each of the plurality of second trenches; and performing, by using the mask layer as a mask, the first ion implantation process on the semiconductor substrate at the bottom portion of each of the plurality of second trenches and at the bottom portion of the communication region of each of the plurality of third trenches with each of the plurality of second trenches along the plurality of openings, to form the bit line doped area in the semiconductor substrate at the bottom portion of each of the plurality of second trenches and at the bottom portion of the communication region of each of the plurality of third trenches with each of the plurality of second trenches.

5. The method for forming the storage device according to claim 1, wherein the source area is formed through a second ion implantation process.

6. The method for forming the storage device according to claim 2, wherein a type of impurity ions doped in the source area is the same as a type of impurity ions doped in the bit line doped area.

7. The method for forming the storage device according to claim 1, wherein forming the plurality of metal gates comprises: forming a metal layer on the surface of the gate dielectric layer and the surface of the first isolation layer; and removing an excess portion of the metal layer through maskless etching to form the plurality of metal gates surrounding the plurality of active areas on the surface of the gate dielectric layer arranged on the side walls of the plurality of active areas.

8. The method for forming the storage device according to claim 3, further comprising:

after forming the plurality of metal gates, forming a second isolation layer covering the plurality of metal gates and filling the plurality of first trenches, the plurality of third trenches and the plurality of second trenches;

and forming, in the second isolation layer in the plurality of third trenches, a plurality of conductive connection structures extending along the second direction and configured to connect the plurality of metal gates with each other.

9. The method for forming the storage device according to claim 1, further comprising:

forming a capacitor connected to the source area on the surface of the semiconductor substrate.

10. The method for forming the storage device according to claim 9, wherein forming the capacitor connected to the source area on the surface of the semiconductor substrate comprises: forming a first dielectric layer on the semiconductor substrate; forming a plurality of through holes, the through holes expose a surface of the source area through the first dielectric layer; forming a contact plug in each of the plurality of through holes; forming a second dielectric layer on the first dielectric layer; forming a capacitor hole, the capacitor hole expose the contact plug through the second dielectric layer; and forming the capacitor in the capacitor hole.

11. The method for forming the storage device according to claim 1, wherein the plurality of active areas are arranged in rows and columns.

12. The method for forming the storage device according to claim 11, wherein forming the plurality of active areas comprises: forming, on the semiconductor substrate, a plurality of first mask patterns arranged parallel to each other and extending along the first direction, wherein a plurality of first openings and a plurality of second openings are alternately arranged between any two of the plurality of first mask patterns adjacent to each other, and a width of each of the plurality of first openings is greater than a width of each of the plurality of second openings; forming, on the plurality of first mask patterns, a plurality of second mask patterns arranged parallel to each other and extending along the second direction, wherein a plurality of sixth openings are provided between any two of the plurality of second mask patterns adjacent to each other; etching the plurality of first mask patterns along the plurality of sixth openings by using the plurality of second mask patterns as masks to form a plurality of third openings extending along the second direction in the plurality of first mask patterns, wherein a remaining portion of the plurality of first mask patterns is formed as a plurality of discrete etching masks;

and etching the semiconductor substrate by using the plurality of etching masks as masks to form the plurality of first trenches corresponding to the plurality of first openings, the plurality of second trenches corresponding to the plurality of second openings, and the plurality of third trenches corresponding to the plurality of third openings in the semiconductor substrate, wherein a plurality of areas between the plurality of first trenches, the plurality of second trenches, and the plurality of third trenches are formed as the plurality of active areas, the plurality of first trenches and the plurality of second trenches communicate with the plurality of third trenches, the depth of each of the plurality of second trenches is less than the depth of each of the plurality of first trenches, and the depth of the region of each of the plurality of third trenches other than the communication region of each of the plurality of third trenches with each of the plurality of second trenches is greater than the depth of each of the plurality of second trenches.

13. The method for forming the storage device according to claim 12, wherein the plurality of first mask patterns and the plurality of second mask patterns are formed through a self-aligned double patterning process.

14. The method for forming the storage device according to claim 13, wherein forming the plurality of first mask patterns comprises: forming a first hard mask layer on the semiconductor substrate; forming, on the first hard mask layer, a plurality of first strip structures extending along the first direction and arranged parallel to each other; forming a first sacrificial spacer layer on side walls and top surfaces of the plurality of first strip structures and on a surface of the first hard mask layer between the plurality of first strip structures; filling a first filling layer between the plurality of first strip structures; removing the first sacrificial spacer layer on surfaces of the side walls of the plurality of first strip structures to form a plurality of fourth openings between the plurality of first strip structures and the first filling layer; etching the first hard mask layer along the plurality of fourth openings to form the plurality of first openings in the first hard mask layer; forming a second filling layer filling the plurality of first openings; forming, on the second filling layer, a plurality of second strip structures extending along the first direction and arranged parallel to each other, wherein each of the plurality of second strip structures covers the second filling layer in a respective one of the plurality of first openings and a portion of the first hard mask layer on both sides of the respective one of the plurality of first openings; forming a second sacrificial spacer layer on side walls and top surfaces of the plurality of second strip structures and on surfaces of the first hard mask layer and the first filling layer between the plurality of second strip structures; filling a third filling layer between the plurality of second strip structures; removing the second sacrificial spacer layer on surfaces of the side walls of the plurality of second strip structures to form a plurality of fifth openings between the plurality of second strip structures and the third filling layer, wherein a width of each of the plurality of fifth openings is less than a width of each of the plurality of fourth openings; and etching the first hard mask layer between the plurality of first openings along the plurality of fifth openings to form the plurality of second openings in the first hard mask layer, wherein the width of each of the plurality of second openings is less than the width of each of the plurality of first openings, and a remaining portion of the first hard mask layer between the plurality of second openings and the plurality of first openings is formed as the plurality of first mask patterns.

* * * * *